(12) United States Patent
Yamaga et al.

(10) Patent No.: US 6,303,908 B1
(45) Date of Patent: Oct. 16, 2001

(54) HEAT TREATMENT APPARATUS

(75) Inventors: Isao Yamaga; Kenji Komuro; Hiroki Kobayashi; Kazuo Miwa, all of Kanagawa-ken (JP)

(73) Assignee: Nichiyo Engineering Corporation, Tokyo (JP)

( * ) Notice: Subject to any disclaimer, the term of this patent is extended or adjusted under 35 U.S.C. 154(b) by 0 days.

(21) Appl. No.: 09/644,905

(22) Filed: Aug. 24, 2000

(30) Foreign Application Priority Data

Aug. 26, 1999 (JP) .................................. 11-240632

(51) Int. Cl.[7] ...................................... F27D 11/00
(52) U.S. Cl. .......................... 219/411; 219/390; 219/405; 118/724; 118/725; 392/416; 392/418
(58) Field of Search ..................... 219/390, 405, 219/411; 118/724, 725, 50.1; 392/416, 418

(56) References Cited

U.S. PATENT DOCUMENTS

| | | | |
|---|---|---|---|
| 4,487,161 | * 12/1984 | Hirata et al. ......................... | 118/723 |
| 4,487,162 | * 12/1984 | Cann .................................... | 118/723 |
| 4,798,926 | * 1/1989 | Sakai ................................. | 219/10.43 |
| 5,167,717 | * 12/1992 | Boitnott ............................... | 118/724 |
| 5,217,560 | * 6/1993 | Kurono et al. ....................... | 156/345 |
| 5,245,171 | * 9/1993 | Hayakawa et al. .................. | 118/723 |
| 5,261,962 | * 11/1993 | Hamamoto et al. ................. | 118/723 |
| 5,453,125 | * 9/1995 | Krogh .................................. | 118/723 |
| 5,472,508 | * 12/1995 | Saxena ................................ | 118/723 |
| 5,478,608 | * 12/1995 | Gorokhovsky ...................... | 427/571 |
| 5,651,826 | * 7/1997 | Takagi ................................ | 118/724 |
| 5,690,050 | * 11/1997 | Doi ............................... | 118/723 MP |

* cited by examiner

Primary Examiner—Teresa Walberg
Assistant Examiner—Shawntina Fuqua
(74) Attorney, Agent, or Firm—Akin, Gump, Strauss, Hauer & Feld, L.L.P.

(57) ABSTRACT

A heat treatment apparatus has a heater 30, which is arranged between a vacuum vessel 2 and a magnetic field generator 20. The electric heater is arranged so as to surround the outer peripheral surface of the vacuum vessel 2, and a fluid cooling section 33 arranged between the electric heater 31 and the magnetic field generator 20.

11 Claims, 7 Drawing Sheets

HEAT TREATMENT APPARATUS

BACKGROUND OF THE INVENTION

1. Field of the Invention

The present invention relates to a heat treatment apparatus which performs a heat treatment in a magnetic field. Particularly, the invention relates to a heat treatment apparatus which applies a heat treatment in a high magnetic field to a magnetic material such as an MR film or a GMR film.

2. Description of the Related Art

A magnetic film such as a thin film of an Fe—Ni alloy or the like formed on a substrate, by sputtering or the like, which is a magnetic material used for a magnetic head or the like can exhibit its magnetic properties by subjecting it to a heat treatment in a high magnetic field.

For this purpose, there is conventionally proposed a heat treatment apparatus in which an electric furnace, an induction heating furnace or the like is disposed to apply a heat treatment in a magnetic field formed with electromagnets. A schematic configuration of a typical conventional heat treatment apparatus is illustrated in FIG. 7.

As shown in FIG. 7, the heat treatment apparatus 1A has a cylindrical vacuum vessel 2, and magnetic field generating means 20 arranged outside the vacuum vessel 2. In the vacuum vessel 2, a holder supporting unit 4 is attached to an upper part thereof. A holder 3 holding an object to be heat-treated such as a magnetic material is charged into the interior by this supporting unit 4 and held. The magnetic field generating means 20 is provided with a pair of electromagnets 21 arranged oppositely outside the vacuum vessel 2, and the electromagnet 21 has a magnetic core 22 and a coil 23.

Heating means 100 is provided between the outer surface of the vacuum vessel 2 and the end face of the magnetic core 22 of the electromagnet 21. Usually, the heating means 100 is spaced apart from the outer surface of the vacuum vessel 2 by a prescribed distance, and comprises electric heaters 101 arranged so as to surround the outer periphery of the vacuum vessel 2. The electric heater 101 is formed, for example as shown in FIG. 7, by providing, for example spiral grooves 103 on the inner periphery of a heater support 102 made of bricks or ceramics arranged so as to surround the vacuum vessel 2, the inner periphery facing the outer periphery of the vacuum vessel. A heating wire such as a nickel-chromium wire 104 is positioned in each of these grooves 103. Heat insulators 105 such as alumina felt or bricks are arranged on the outer periphery of the heater support 102 so that heat of the heating means 100 is not transferred to the electromagnets 21.

In the conventional heat treatment apparatus, however, since the heating means 100 with the structure as mentioned above is provided between the outer periphery of the vacuum vessel 2 and the magnetic core of each of the electromagnets 21, the distance between the magnetic cores 22 and 22 of the pair of electromagnets 21 is inevitably large. The distance (L) between the inner surface of the vacuum vessel 2 and the magnetic core 22 is usually within a range of from 135 to 250 mm. If the vacuum vessel 2 is assumed to have an outside diameter (D1) of 240 mm, the distance (LO) between the magnetic cores 22 of the electromagnets 21 would therefore be within a range of from 520 to 700 mm.

In order to achieve a uniform magnetic field and a prescribed magnetic field strength, therefore, the electromagnet composing the magnetic field generating means 20 must necessarily be large in size, and the current fed to the electromagnet 21 must be increased. The increase in weight and current resulting from the use of larger electromagnets leads to the necessity to provide a larger equipment space and a larger power supplying facility.

Adoption of a larger electromagnet leads to a larger overall construction of the heat treatment apparatus, and considerably increases the equipment cost and the running cost.

Furthermore, with the aforementioned heating means, in which bricks or the like are used as heat insulators, dust is produced, and this causes problems when using in a clean room.

SUMMARY OF THE INVENTION

An object of the present invention is therefore to provide a heat treatment apparatus which can generate a uniform magnetic field with a desired strength by the use of relatively small-sized magnetic field generating means, permits rapid heating and cooling, and makes it possible to sufficiently improve properties of a magnetic material.

Another object of the invention is to provide a heat treatment apparatus which improves the degree of freedom for design, permits downsizing of the overall configuration of the apparatus, reduction of the equipment cost, inhibition of power consumption and considerable reduction of the equipment running cost, while avoiding heating of the magnetic field generating means by the increase in temperature of the electric furnace and thus without limiting the material selection.

Still another object of the invention is to provide a heat treatment apparatus which does not use an apparatus component parts which may produce waste, and is applicable in a clean room.

The aforementioned objects are achieved by the heat treatment apparatus of the present invention. In summary, the present invention provides a heat treatment apparatus comprising a vacuum vessel, magnetic field generating means arranged outside the vacuum vessel, and heating means arranged between the vacuum vessel and the magnetic field generating means; wherein the heating means comprises:

an electric heater arranged so as to surround the outer periphery of the vacuum vessel; and a fluid cooling section arranged between the electric heater and the magnetic field generating means.

According to an embodiment of the invention, the heating means comprises an electrically insulating inner cylinder arranged so as to surround the outer periphery of the vacuum vessel, and said inner cylinder is arranged between the vacuum vessel and the electric heater. Preferably, the vacuum vessel and the inner cylinder are made of an optically transparent material.

According to another embodiment of the invention, the electric heater comprises a resistance-heating wire covered with an electrically insulating tube. Preferably, the resistance-heating wire is a nickel-chromium wire, or a non-magnetic metal heater made of a noble metal, and the electrically insulating tube is a tube made by knitting alumina fibers, or a tube made by connecting a plurality of quartz or alumina tubes.

According to still another embodiment of the invention, in the electric heater, the current flowing through the resistance-heating wire flows in a counter current to the current flowing through an adjacent resistance-heating wire to avoid inducing of occurrence of a magnetic field caused by the applied current.

According to further another embodiment of the invention, the fluid cooling section is a water-cooled jacket through which a fluid flows.

According to another embodiment, a sheet-shaped electric insulator may be arranged between the water-cooled jacket and the electric heater. Preferably, the water-cooled jacket is made of a metal.

According to another embodiment of the invention, the magnetic field generating means comprises electromagnets oppositely arranged outside the vacuum vessel, and the distance (L) between the end face of the magnetic core of the electromagnet and the inner surface of the vacuum vessel is within a range of from at least 0.05 times to up to 0.15 times as long as the distance (LO) between the magnetic cores of the magnetic field generating means, or more specifically, from at least 15 mm to up to 45 mm, or preferably, from at least 15 mm to up to 30 mm.

DESCRIPTION OF THE PREFERRED EMBODIMENTS

The heat treatment apparatus of the present invention will now be described further in detail with reference to the drawings.

Figure 1:
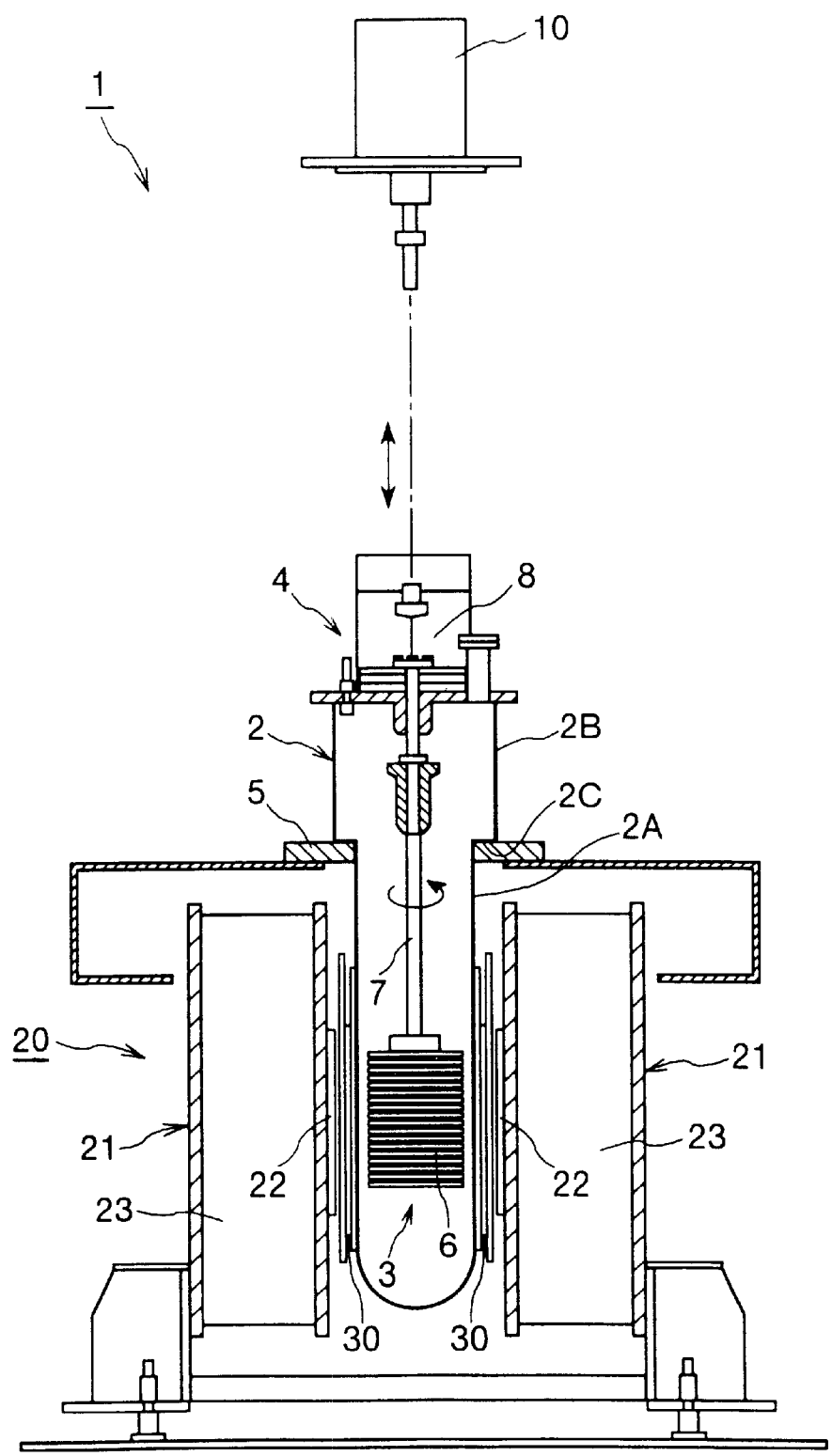
FIG. 1 is a schematic configuration sectional view of an embodiment of the heat treatment apparatus of the present invention.

FIG. 1 illustrates a schematic overall configuration of an embodiment of the heat treatment apparatus 1 of the invention. The heat treatment apparatus 1 of this embodiment has a vacuum vessel 2, and magnetic field generating means 20 arranged outside the vacuum vessel 2, as in the conventional heat treatment apparatus 1A.

In this embodiment, the vacuum vessel 2 comprises a stepped cylindrical container having a vessel main body 2A having a smaller diameter, and a vessel attachment section 2B, having a larger diameter, formed integrally with the vessel main body 2A on the top thereof. The lower end of the vessel main body 2A is closed, and the upper end of the vessel attachment section 213 is open. The upper end of the vessel is closely sealed by attaching a holder supporting unit 4 for supporting a holder 3 installed in the vessel, to the upper end of the vessel. An annular shoulder 2C formed between the main body 2A of the vacuum vessel 2 and the vessel attachment section 2B is mounted on a base 5, and the vacuum vessel 2 is held there.

The vacuum vessel 2 should preferably be made of ceramics such as quartz glass for its stability during rapid cooling. In the invention, as described later in detail, heating in vacuum by heating means 30 is accomplished mainly by radiation heat. The quartz glass should therefore preferably be an optically transparent one. The vacuum vessel 2, which may have a thickness within a range of from 2 to 6 mm, has a thickness of 3 mm in this embodiment.

The holder 3 comprises about 30 trays 6 for mounting a substrate having a diameter of from about 100 to 200 mm and having, for example an Fe—Ni alloy film formed by sputtering. The trays 6 are supported by a supporting shaft 7, the upper end of which is suspension-supported by the holder supporting unit 4.

The holder supporting unit 4 should preferably rotatably hold the holder 3 so that the direction of the object to be heat-treated held by the holder 3 can be changed relative to the magnetic field direction. In this embodiment, therefore, a driving motor 8 is attached to the holder supporting unit 4 so that the rotary supporting shaft 7 of the holder 3 can be rotation-driven.

The vacuum vessel 2 can be maintained in a prescribed vacuum state by evacuating the interior of the vacuum vessel by means of a vacuum pump (not shown) provided on the top of the vacuum vessel, after attaching the holder supporting unit 4 to the upper end of the vacuum vessel. For example, when the object to be heat-treated is a magnetic metal thin film, the object should preferably be heat-treated in vacuum, or more specifically, in a vacuum of up to 1 Pa to avoid oxidation of the metal thin film.

The holder supporting unit 4 is detachably attached to the upper end of the vessel. The holder 3 can therefore be moved, together with the holder supporting unit 4, by a lift 10 upward outside the vessel 2, and in this state, it is possible to mount an object to be heat-treated such as a magnetic material onto the holder 3 or remove the same from the holder 3.

The magnetic field generating means 20 is provided with a pair of electromagnets 21 oppositely arranged, and each electromagnet 21 has a magnetic core 22 and a coil 23. According to the present invention, as described later in detail, the heating means 30 arranged between the vacuum vessel 2 and the magnetic core 22 may have a smaller thickness, and it is therefore possible to reduce the distance between the magnetic cores 22 and 22 of the electromagnets 21 in pair. Therefore, the electromagnet 21 itself can be downsized. According to the invention, furthermore, since the magnetic core 22 is not heated, low thermal resistance materials can be used. In this embodiment, therefore, it is possible to use a magnetic field density produced with the magnetic field generating means 20 of at least 500 gauss, or particularly, within a range of from 1,000 to 20,000 gauss. In this embodiment, the distance (LO) between the magnetic cores 22 (see FIG. 2) is 300 mm.

Figure 2:
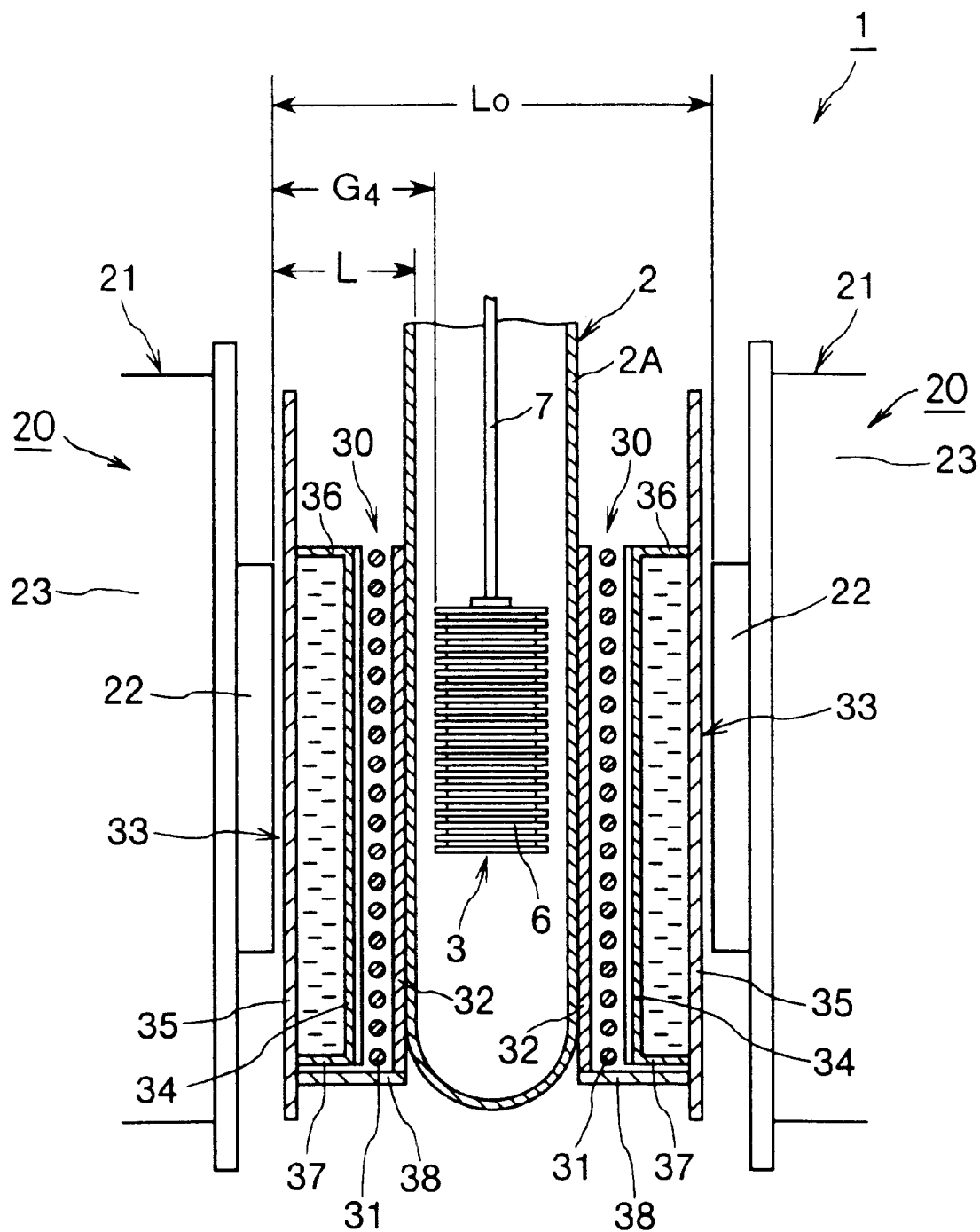
FIG. 2 is a partial sectional view illustrating relative positions of a vacuum vessel, heating means and an electromagnet.
Figure 3:
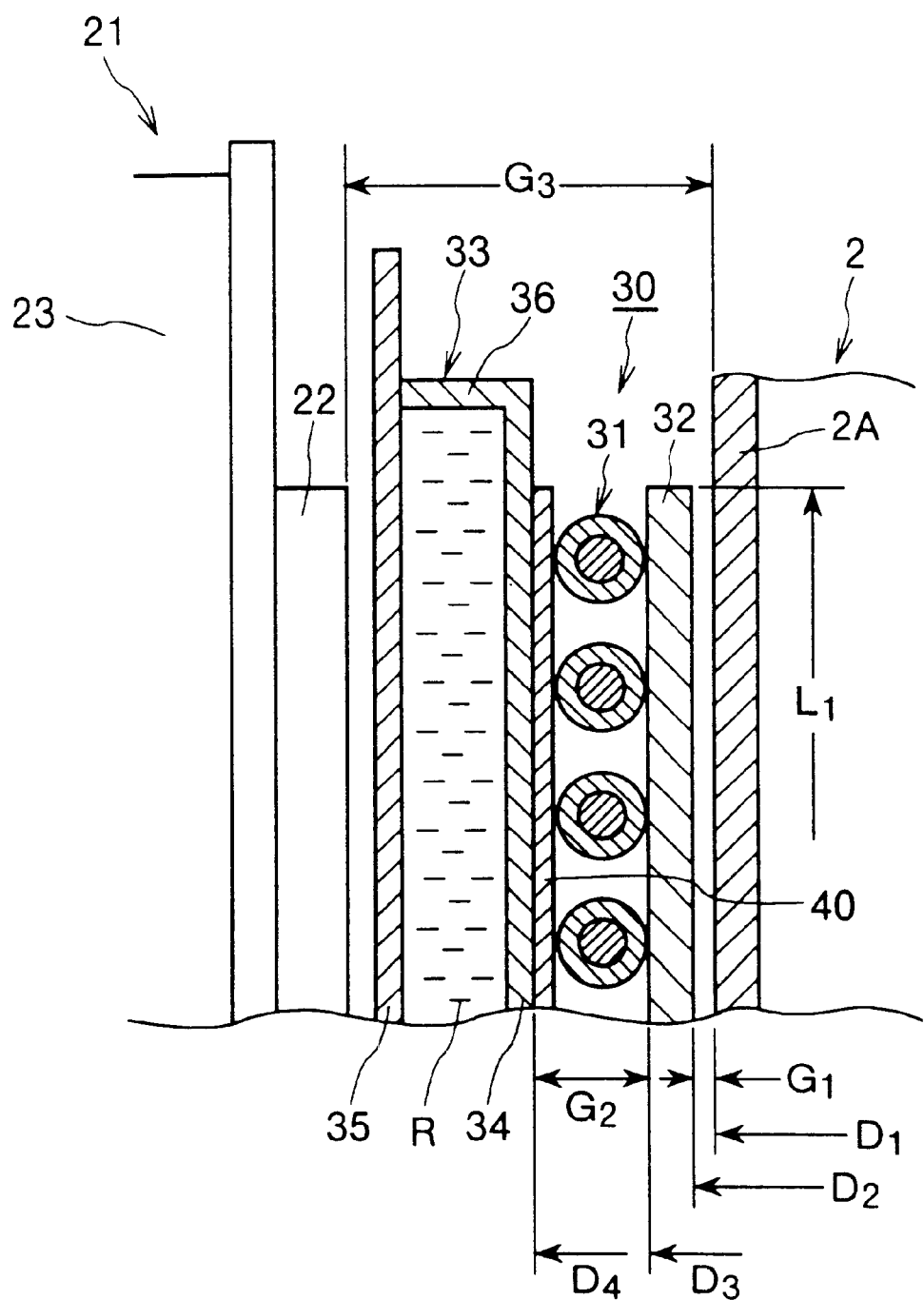
FIG. 3 is a partial enlarged sectional view of the heating means.

As is understood by referring to FIGS. 2 and 3, the thin-shaped heating means 30 is provided between the outer surface of the vessel main body 2A of the vacuum vessel 2 and the end face of the magnetic core 22 of the electromagnet 21. According to the invention, there is provided an electric heater 31 based on electric-resistance heating, serving as the heating means 30. Such heating means 30 is preferable as compared with induction heating means requiring an expensive power source because of the low cost.

More specifically, the heating means 30 has an electrically insulating inner cylinder 32 arranged so as to surround the outer periphery of the vacuum vessel main body 2A, and a water-cooled jacket forming a fluid cooling section 33 spaced apart from the inner cylinder 32 by a prescribed distance. The inner cylinder 32 can be manufactured from a quartz glass tube having a thickness of from 2 to 6 mm. A gap (G1) of from 2 to 4 mm is provided between the inner cylinder 32 and the outer periphery of the vacuum vessel main body 2A. In this embodiment, in which the vacuum vessel main body 2A has an outside diameter (D1) of 240 mm, the inner cylinder 32 has an inside diameter (D2) of 245 mm. The inner cylinder 32 has an axial length (L1) of 450 mm.

The water-cooled jacket 33 is a cylinder having a dual tube structure with an inner wall 34 and an outer wall 35, and the upper end and the lower end thereof are closed by an upper wall 36 and the lower wall 37, respectively. In this embodiment, as shown in FIG. 2, the outer wall 35 is extended below the lower wall 37 in the axial direction, and an annular supporting plate 38 is integrally secured to the lower extension to support the inner cylinder 32. Although not shown, the water-cooled jacket 33 has a water supply port formed in a lower part of the jacket, and a water discharge port formed in an upper part of the jacket to ensure the flowing of a cooling fluid which is usually water. The cooling fluid R may be circulated.

Figure 4:
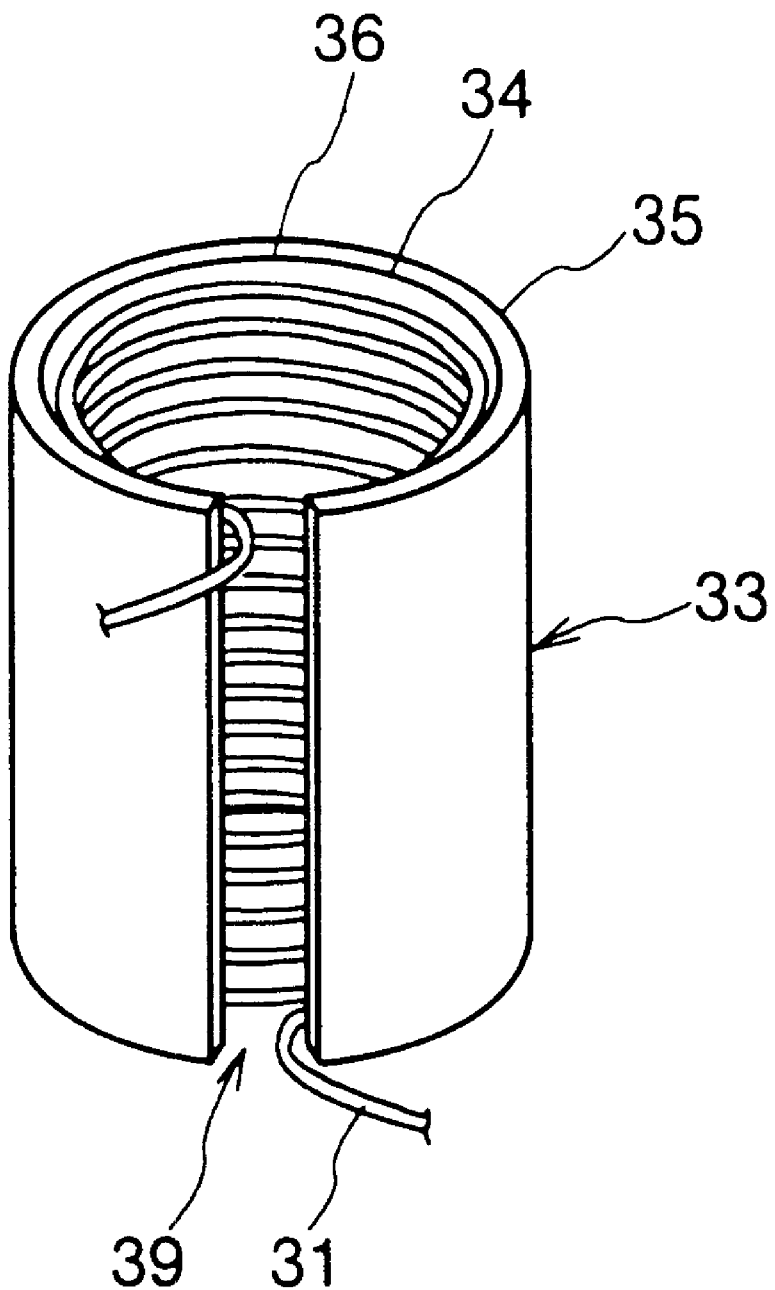
FIG. 4 is a perspective view illustrating a whole view of an embodiment of the water-cooled jacket.

As shown in FIG. 4, the water-cooled jacket 33 may be formed so as to have a slit 39 extending in the axial direction, not in a continuous cylindrical form in the circumferential direction. In this case, it is possible to take out a terminal of the heater 31 installed in the water-cooled jacket 3 by using the slit 39.

The water-cooled jacket 33 is made of a material having a high thermal conductivity such as a metal. In this embodiment, the inner wall 34, the outer wall 35, the upper wall 36 and the lower wall 37 are manufactured with stainless steel plates having a thickness of 3 mm. A gap (G2) of from 8 to 13 mm for arranging the heater 31 is provided between the inner surface of the inner wall 34 of the water-cooled jacket 33 surrounding the inner cylinder 32 and the inner cylinder 32. In this embodiment, in which the inner cylinder 32 has an outside diameter (D3) of 253 mm, the water-cooled jacket 33 has an inside diameter (D4) of 272 mm. The inner wall 34 of the water-cooled jacket 33 has an axial length sufficient to completely cover the heating means 30.

The heating means 30 will be described further. According to the present invention, the heating means 30 has an electric heater 31 as described above, and is spirally wound around the outer periphery of the inner cylinder 32.

Figure 5:
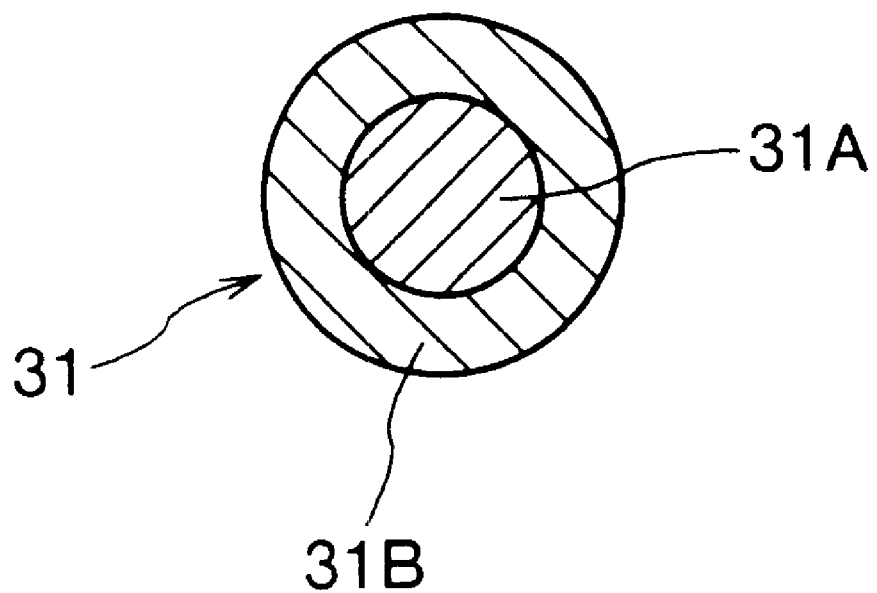
FIG. 5 is a sectional view of an electric heater.

According to the invention, the electric heater 31 is formed by covering a resistance-heating wire 31A with an electrically insulating tube 31B as shown in FIG. 5. The resistance-heating wire 31A may suitably be made of a nickel-chromium wire or a noble metal non-magnetic heater such as platinum. The electrically insulating tube 31B is a tube made by knitting fibrous alumina fibers, or connecting a plurality of quartz or alumina tubes. In this embodiment, the resistance-heating wire 31A is prepared by covering a nickel-chromium wire having a diameter of from 2.0 to 2.6 mm with the tube 31B made by knitting alumina fibers, into an outside diameter of 3.5 mm.

The resistance-heating wire 31A, being placed in a magnetic field produced by the magnetic field generating means as described above, is subjected to application of a force resulting from the interaction with the magnetic field caused by the current for heating, leading to contact between resistance wires. Therefore, the resistance-heating wire 31A, preferably should be electrically insulated with the insulating tube 31B.

In order to reduce the force resulting from the interaction, it is desirable to adopt the so-called non-inducing winding in which the flow of current of the resistance-heating wire 31A is arranged so as to cancel the resultant magnetic field.

Figure 6:
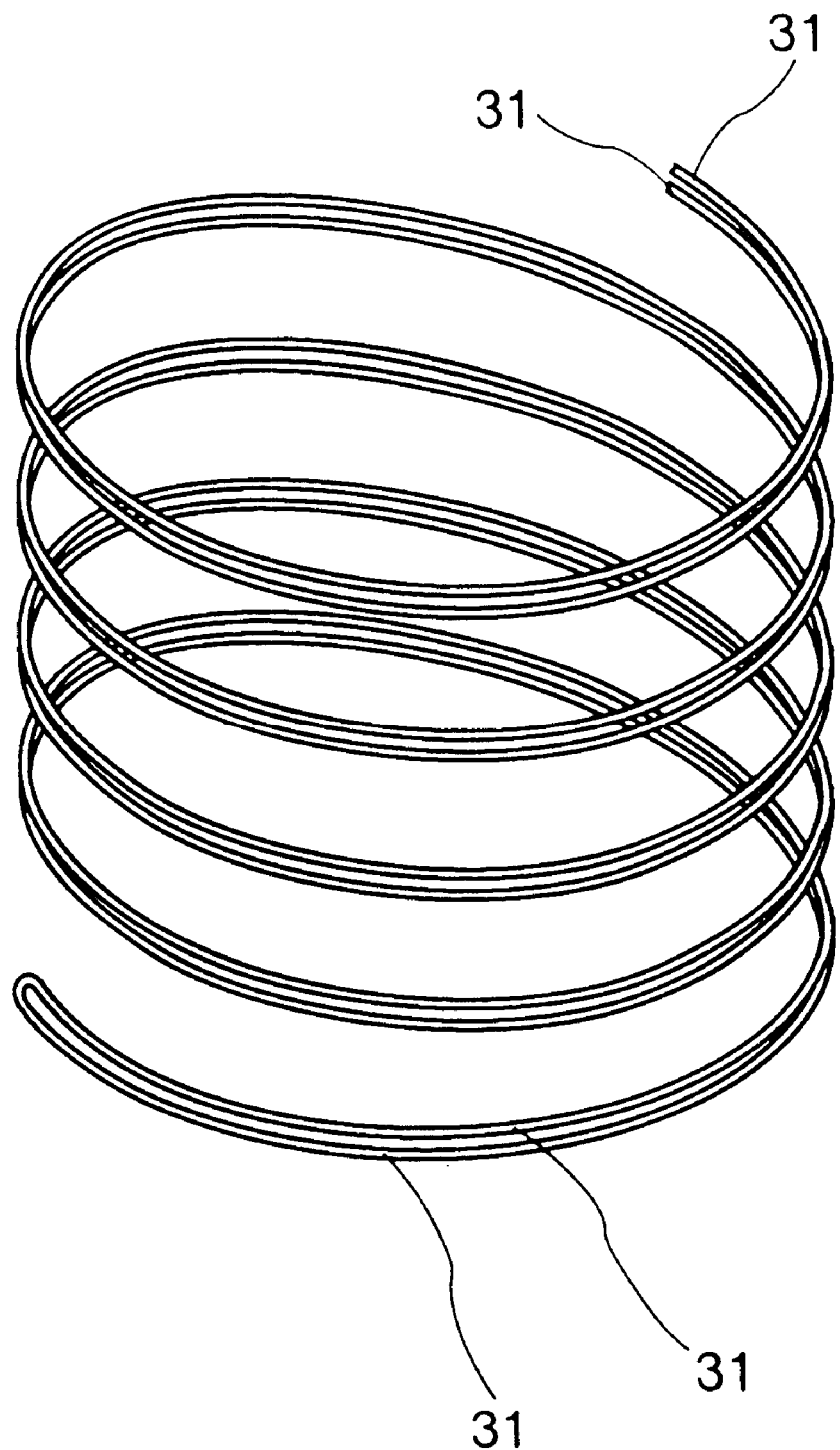
FIG. 6 is a perspective view illustrating a method for installing the electric heater.
Figure 7:
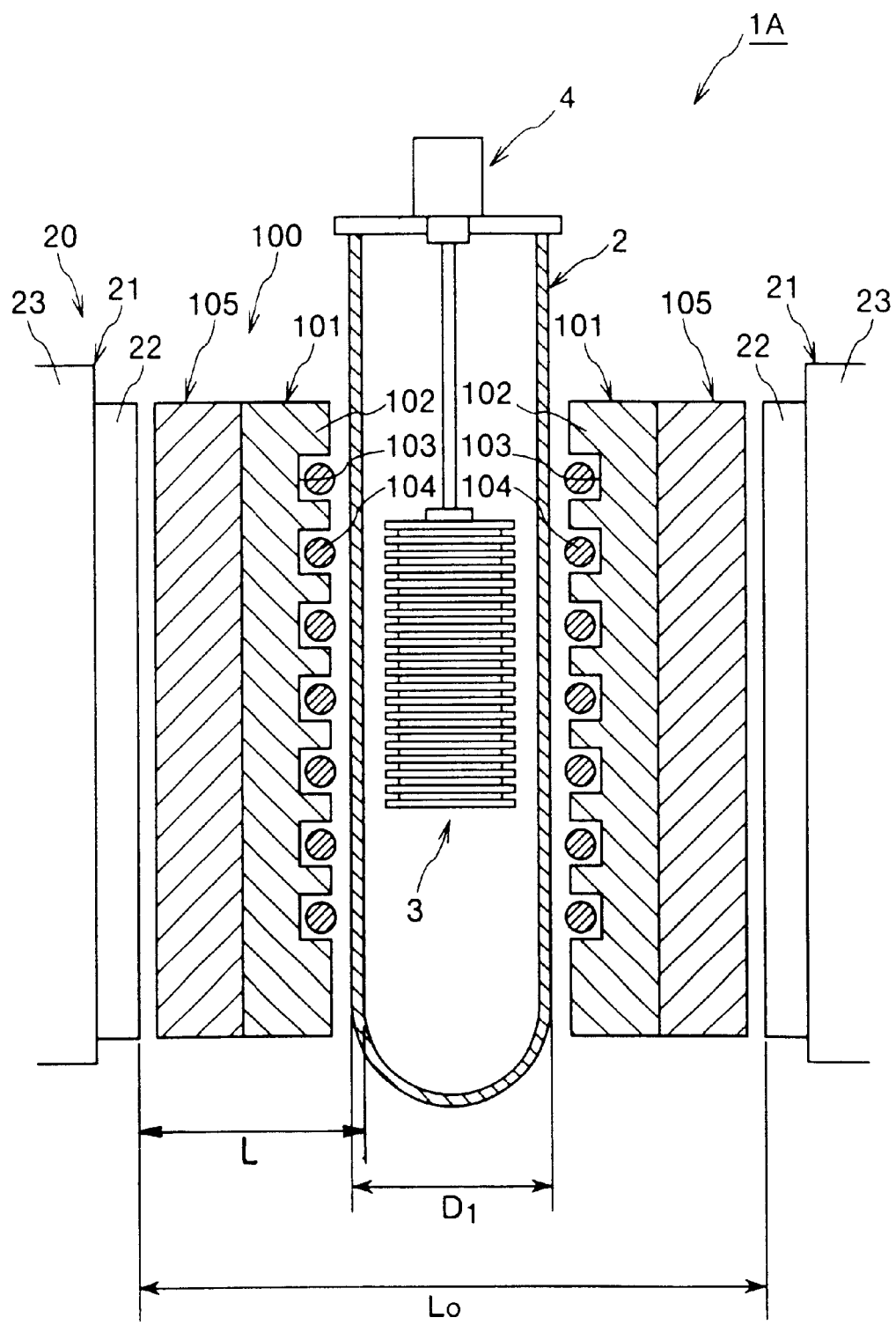
FIG. 7 is a schematic configurational sectional view of a conventional heat treatment apparatus.

More specifically, as shown in FIG. 6, the heater 31 is wound on the inner cylinder 32 into a single-layer winding in a dual-wire state in which the wire is connected at an end, i.e., in a U shape. The directions of the currents flowing through axially adjacent turns of the resistance-heating wire 31A are counter to each other, thus causing the magnetic fields generated by the flow of current through the resistance-heating wire 31A to cancel each other. If the heater 31 is made by merely winding a single wire, the magnetic field from the magnetic field generating means 20, when current flows through the resistance-heating wire 31A, applies a force onto the resistance-heating wire 31A, resulting in a shift or vibration of the heater 31, as stated above.

To ensure stable cancellation of such a force, the heating current should preferably be a direct current. Control means for controlling the temperature is usually provided in the heating means 30 to control the energizing of the heater 31.

Usually, the heat treatment temperature is within a range of from a 150° C. to 500° C. When heat-treating a magnetic film having a high ordering temperature of the structure of film, however, the temperature should be within a range of from 500° C. to 800° C. When heat-treating a magnetic film for an MR device, the cooling rate should be at least 50° C./minute, or particularly, within a range of from 100° C./minute to 200° C./minute.

No heat insulating material should preferably be provided around the heater 31. Because the water-cooled jacket 33 is made of stainless steel in this embodiment, an alumina sheet 40 serving as a sheet-shaped electric insulator should preferably be arranged between the water-cooled jacket 33 and the heater 31. The alumina sheet 40 may have a thickness within a range of from 1 to 3 mm. The electric insulator in the gap between the heater 31 and the water-cooled jacket 33 should preferably have a thickness of up to 4 mm. The heater 31 may be wound on the inner peripheral surface of the alumina sheet 40 without providing the inner cylinder 2.

According to the present invention, as is understood from the aforementioned embodiment, the gap (G3) between the outer surface of the vacuum vessel 2 and the magnetic core 22 has a size of 27.5 mm, this representing a considerable reduction as compared with that in the conventional apparatus shown in FIG. 5 within a range of from 40 to 50 mm.

According to the results of the experiments carried out by the present inventors, the distance (L) between the end face of the magnetic core 22 of the magnetic field generating means 21 facing the water-cooled jacket 33 and the inner surface of the vacuum vessel 2 was found to be preferably within a range of from at least 0.05 times to up to 0.15 times the distance (LO) between the magnetic cores of the magnetic field generating means 21, or more specifically, from at least 15 mm to up to 45 mm, or more preferably, up to 30 mm.

The aforementioned heat treatment apparatus further comprises a power source for the magnetic field generating mean, a magnetic field measuring controller, a control unit for the vacuum pump for evacuating the vacuum vessel, and a mechanism for controlling the operating sequence of the overall apparatus. These means may be ones well known by a person skilled in the art. Detailed description thereof is therefore omitted here.

According to the present invention, as described above, in a heat treatment apparatus having a vacuum vessel, magnetic field generating means arranged outside the vacuum vessel, and heating means arranged between the vacuum vessel and the magnetic field generating means, the heating means comprises an electric heater arranged so as to surround the outer peripheral surface of the vacuum vessel and a fluid cooling section arranged between the electric heater and the magnetic field generating means. There are therefore available the following advantages:

(1) With a relatively small-sized magnetic field generating means, it is possible to generate a uniform magnetic field having a desired strength, conduct rapid heating and cooling, and sufficiently improve the properties of magnetic materials or the like;

(2) The magnetic field generating means is never heated by the increase in temperature of the electric furnace. It is therefore possible to improve the degree of freedom in design, without any limitation on material selection, reduce the size of the overall apparatus, reduce the apparatus cost, reduce the power consumption, and remarkably curtail the apparatus running cost; and (3) No waste-producing component is used as the parts of the apparatus, thus permitting the use of the apparatus in a clean room.

What is claimed is:

1. A heat treatment apparatus comprising a vacuum vessel, magnetic field generating means arranged outside said vacuum vessel, and heating means arranged between said vacuum vessel and said magnetic field generating means; wherein said heating means comprises:

an electric heater arranged so as to surround the outer periphery of said vacuum vessel; and a fluid cooling section arranged between said electric heater and said magnetic field generating means.

2. A heat treatment apparatus according to claim 1, wherein said heating means comprises an electrically insulating inner cylinder arranged so as to surround the outer periphery of said vacuum vessel, and said inner cylinder is arranged between said vacuum vessel and said electric heater.

3. A heat treatment apparatus according to claim 1, wherein said electric heater comprises a resistance-heating wire covered with an electrically insulating tube.

4. A heat treatment apparatus according to claim 3, wherein said resistance-heating wire is a nickel-chromium wire, or a non-magnetic metal heater made of a noble metal; and said electrically insulating tube is a tube made by knitting alumina fibers, or a tube made by connecting a plurality of quartz or alumina tubes.

5. A heat treatment apparatus according to claim 3, wherein, in said electric heater, currents flowing through the adjacent resistance-heating wires flow in the opposite directions to each other.

6. A heat treatment apparatus according to claim 1, wherein said fluid cooling section is a water-cooled jacket through which a fluid flows.

7. A heat treatment apparatus according to claim 6, wherein a sheet-shaped electric insulator is arranged between said water-cooled jacket and said electric heater.

8. A heat treatment apparatus according to claim 7, wherein said water-cooled jacket is made of a metal.

9. A heat treatment apparatus according to claim 1, wherein said magnetic field generating means comprises electromagnets oppositely arranged outside said vacuum vessel, and the distance (L) between the end face of the magnetic core of said electromagnet and the inner surface of said vacuum vessel is within a range of from at least 0.05 times to up to 0.15 times as long as the distance ($L0$) between the magnetic cores of said magnetic field generating means.

10. A heat treatment apparatus according to claim 1, wherein the distance (L) between the end face of the magnetic field generating means and the inner surface of said vacuum vessel is within a range of from at least 15 mm to up to 45 mm.

11. A heat treatment apparatus according to claim 1, wherein the distance (L) between the end face of the magnetic field generating means and the inner surface of said vacuum vessel is within a range of from at least 15 mm to up to 30 mm.

* * * * *